(12) United States Patent
Song

(10) Patent No.: US 8,981,392 B2
(45) Date of Patent: Mar. 17, 2015

(54) LIGHT EMITTING DEVICE PACKAGE AND METHOD OF MANUFACTURING THE SAME

(71) Applicant: Samsung Electronics Co., Ltd., Suwon-si, Gyeonggi-do (KR)

(72) Inventor: Ho Young Song, Suwon (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/841,733

(22) Filed: Mar. 15, 2013

(65) Prior Publication Data

US 2014/0131748 A1    May 15, 2014

(30) Foreign Application Priority Data

Nov. 14, 2012    (KR) .................. 10-2012-0128860

(51) Int. Cl.
| | | |
|---|---|---|
| H01L 33/00 | (2010.01) | |
| H01L 25/075 | (2006.01) | |
| H01L 33/50 | (2010.01) | |
| H01L 33/54 | (2010.01) | |

(52) U.S. Cl.
CPC ........... *H01L 25/0753* (2013.01); *H01L 33/505* (2013.01); *H01L 33/54* (2013.01); *H01L 2933/0041* (2013.01)
USPC ................... 257/89; 257/88; 257/90; 257/91; 257/E33.001; 257/E33.056; 257/E33.059; 257/E33.06; 257/E33.061

(58) Field of Classification Search
CPC ..... H01L 33/50; H01L 33/501; H01L 33/502; H01L 33/504; H01L 33/505; H01L 33/507; H01L 33/508; H01L 27/3206; H01L 27/3209; H01L 27/3211; H01L 27/3213; H01L 27/3216; H01L 27/3218
USPC .......... 257/88, 89, 90, 91, E33.001, E33.056, 257/E33.059, E33.06, E33.061
See application file for complete search history.

(56) References Cited

U.S. PATENT DOCUMENTS

| | | | |
|---|---|---|---|
| 6,252,254 B1 * | 6/2001 | Soules et al. ..................... 257/89 |
| 7,872,659 B2 | 1/2011 | Seetzen | |
| 2005/0221518 A1 * | 10/2005 | Andrews et al. ................ 438/27 |
| 2008/0012036 A1 * | 1/2008 | Loh et al. ......................... 257/99 |
| 2008/0237614 A1 * | 10/2008 | Ishikura et al. .................. 257/89 |
| 2008/0308822 A1 * | 12/2008 | Tsang et al. ..................... 257/89 |
| 2009/0008655 A1 * | 1/2009 | Peeters et al. ................... 257/89 |
| 2010/0073917 A1 * | 3/2010 | Loh et al. ...................... 362/97.3 |
| 2010/0133571 A1 * | 6/2010 | Kawasaki et al. ............... 257/98 |
| 2011/0193110 A1 | 8/2011 | Chang et al. | |
| 2011/0228514 A1 | 9/2011 | Tong et al. | |

(Continued)

FOREIGN PATENT DOCUMENTS

KR    2010-0042066    4/2010

*Primary Examiner* — Eva Y Montalvo
*Assistant Examiner* — Samuel Lair
(74) *Attorney, Agent, or Firm* — McDermott Will & Emery LLP

(57) ABSTRACT

There is provided a light emitting device package including: a package substrate; a blue light emitting device and a green light emitting device mounted on the package substrate; a flow prevention part formed on the package substrate and substantially enclosing the blue light emitting device; and a wavelength conversion part including a red wavelength conversion material and formed on a region defined by the flow prevention part to cover the blue light emitting device, so that white light having a high degree of color reproducibility may be emitted thereby.

14 Claims, 13 Drawing Sheets

(56) References Cited

U.S. PATENT DOCUMENTS

| | | | |
|---|---|---|---|
| 2012/0012867 A1* | 1/2012 | Shen et al. | 257/89 |
| 2012/0068594 A1* | 3/2012 | Ibbetson et al. | 313/501 |
| 2012/0087108 A1 | 4/2012 | Ke et al. | |
| 2012/0097997 A1* | 4/2012 | Chung et al. | 257/89 |
| 2012/0099303 A1* | 4/2012 | Li et al. | 362/231 |
| 2012/0161165 A1* | 6/2012 | Yamazaki | 257/88 |
| 2013/0134445 A1* | 5/2013 | Tarsa et al. | 257/88 |

\* cited by examiner

LIGHT EMITTING DEVICE PACKAGE AND METHOD OF MANUFACTURING THE SAME

CROSS-REFERENCE TO RELATED APPLICATIONS

This application claims the priority of Korean Patent Application No. 10-2012-0128860 filed on Nov. 14, 2012, in the Korean Intellectual Property Office, the disclosure of which is incorporated herein by reference.

BACKGROUND

1. Field

Aspects of exemplary embodiments relate to a light emitting device package and a method of manufacturing the same.

2. Description of the Related Art

In recent years, light emitting diodes (LEDs) have commonly been used as backlight units for display devices provided in notebook computers, monitors, mobile phones, TVs and the like, or as white light sources for lighting devices and the like. In line with this trend, various attempts to emit white light using LEDs have been implemented. For example, a blue LED may be combined with a yellow phosphor or a blue LED may be combined with red and green phosphors. However, a general method of emitting white light may increase power consumption resulting from a reduction in color reproducibility and luminous intensity. Therefore, a method of achieving a high degree of color reproducibility of white light is required.

SUMMARY

An aspect of an exemplary embodiment provides a light emitting device package able to emit white light having a high degree of color reproducibility.

An aspect of an exemplary embodiment also provides a method of manufacturing the above-mentioned light emitting device package.

According to an aspect of an exemplary embodiment, there is provided a light emitting device package including: a package substrate; a blue light emitting device and a green light emitting device mounted on the package substrate; a flow prevention part formed on the package substrate and substantially enclosing the blue light emitting device; and a wavelength conversion part including a red wavelength conversion material and formed on a region defined by the flow prevention part to cover the blue light emitting device.

The flow prevention part may be a protrusion part substantially enclosing the blue light emitting device.

A height of the protrusion part may be substantially equal to a mounting height of the blue light emitting device.

The protrusion part may include a plurality of protrusion parts having respective heights increased in a direction away from the blue light emitting device, and the wavelength conversion part may be formed in a region defined by any one of the plurality of protrusion parts.

The flow prevention part may be a groove part substantially enclosing the blue light emitting device.

The groove part may include a plurality of groove parts, and the wavelength conversion part may be formed in a region defined by any one of the plurality of groove parts.

The light emitting device package may further include a recess part formed in the package substrate, wherein the blue light emitting device may be disposed within the recess part and the green light emitting device is disposed outside the recess part, and the flow prevention part may be a boundary surface of the recess part.

A height of the boundary surface of the recess part may be substantially equal to a mounting height of the blue light emitting device.

The wavelength conversion part may have hydrophilic properties or hydrophobic properties, and the flow prevention part may have hydrophobic properties or hydrophilic properties opposite to those of the wavelength conversion part and may be provided as a hydrophobic region or a hydrophilic region substantially enclosing the blue light emitting device.

The light emitting device package may further include an encapsulation part formed on the package substrate. When a combination of light emitted from the blue light emitting device and light emitted from the wavelength conversion part is defined as first combined light, the first combined light may be mixed with light emitted from the green light emitting device within the encapsulation part.

The encapsulation part may include a second wavelength conversion material.

The second wavelength conversion material may be a red wavelength conversion material, and a concentration of the second wavelength conversion material may be lower than that of the red wavelength conversion material included in the wavelength conversion part.

When a combination of the first combined light and the light emitted from the green light emitting device is defined as second combined light, a concentration of the second wavelength conversion material may be set to correct a deviation of actual color characteristics of the second combined light from desired color characteristics thereof.

According to another aspect of an exemplary embodiment, there is provided a method of manufacturing a light emitting device package, the method including: preparing a blue light emitting device, a green light emitting device, and a wavelength conversion part including a red wavelength conversion material and formed on a top surface of the blue light emitting device; measuring color characteristics of first combined light when the first combined light is defined by a combination of light emitted from the blue light emitting device and light emitted from the wavelength conversion part; mounting the blue light emitting device having the wavelength conversion part formed thereon and the green light emitting device on the package substrate; and forming an encapsulation part on the package substrate.

The encapsulation part may include a second wavelength conversion material. When a combination of the first combined light and light emitted from the green light emitting device is defined as second combined light, a concentration of the second wavelength conversion material may be set to correct a deviation of actual color characteristics of the second combined light from desired color characteristics thereof based on the measured color characteristics of the first combined light.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF EXEMPLARY EMBODIMENTS

Figure 1A:
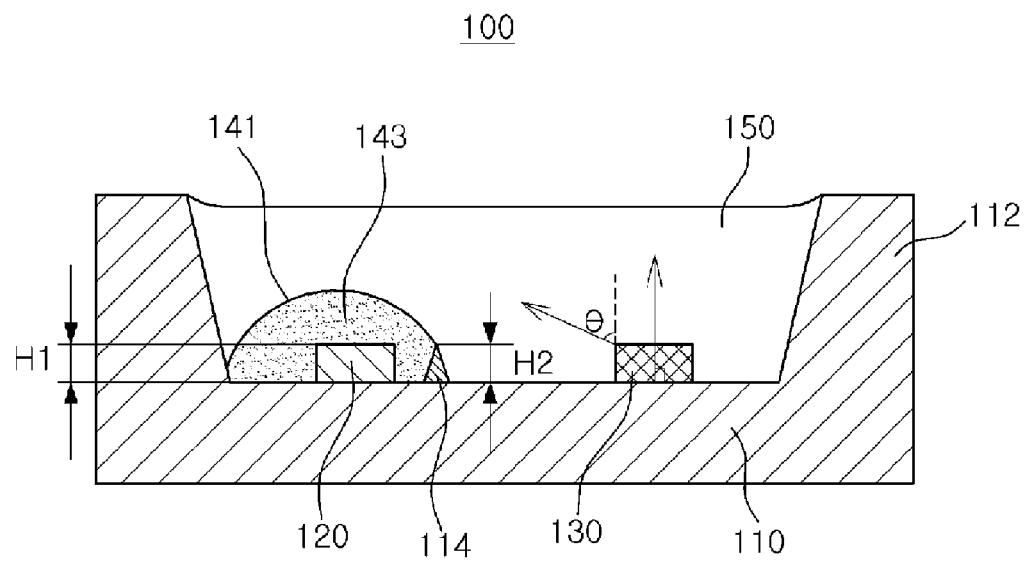
FIGS. 1A and 1B are views illustrating a light emitting device package according to an exemplary embodiment.

Hereinafter, exemplary embodiments will be described in detail with reference to the accompanying drawings.

Exemplary embodiments may, however, be embodied in many different forms and should not be construed as being limited to exemplary embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

Figure 1B:
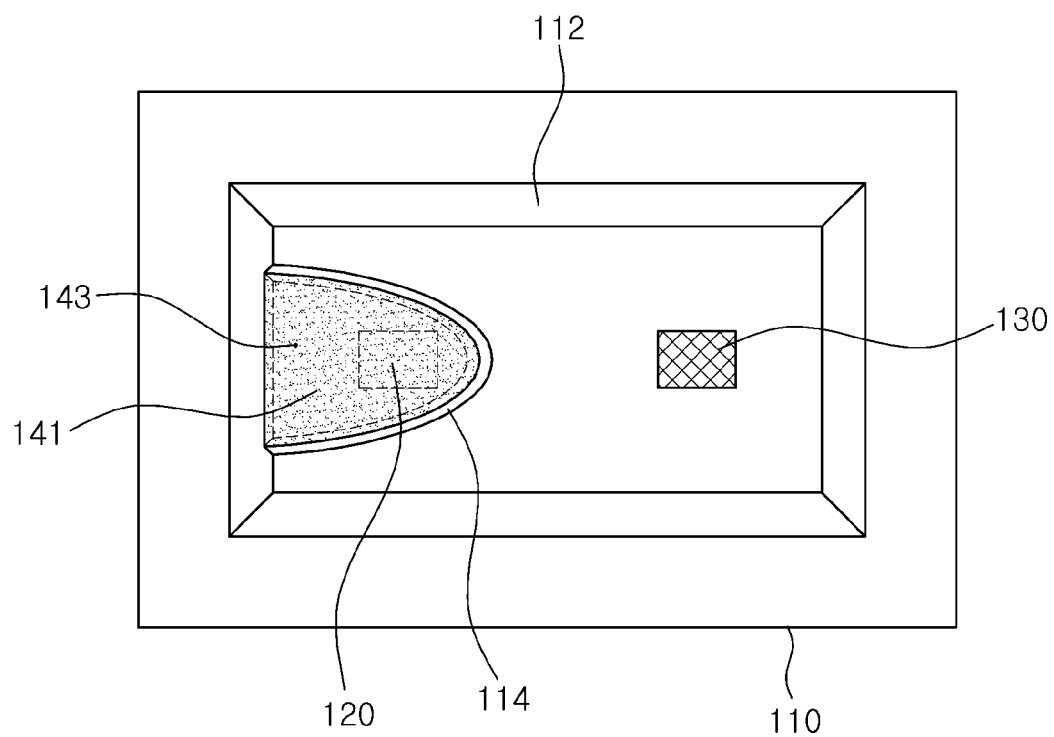

FIGS. 1A and 1B are cross-sectional and plan views illustrating a light emitting device package according to an exemplary embodiment, respectively.

With reference to FIGS. 1A and 1B, a light emitting device package 100 may include a package substrate 110, a blue light emitting device 120, a green light emitting device 130 and a wavelength conversion part 141 including a red wavelength conversion material 143.

The package substrate 110 is provided as a mounting substrate for the light emitting devices. The package substrate 110 may be formed of a translucent resin or a resin having a high degree of reflectivity. The package substrate 110 may be formed of a polymer resin facilitating injection molding. However, a type of resin for the package substrate 110 is not limited thereto, and other types of resin may be used therefore. That is, a non-conductivity type material such as ceramic may be used, and in this case, the release of heat is facilitated. In addition, the package substrate 110 may be a printed circuit board (PCB) on which wiring patterns are printed.

A partition wall 112 provided with a reflective portion may be formed to enclose the package substrate 110. In this case, the outward emission of light emitted from the light emitting device mounted on the package substrate 110 may be further enhanced.

The blue light emitting device 120 and the green light emitting device 130 may be photoelectric devices able to emit light when electrical signals are applied thereto. As a representative light emitting device, a semiconductor light emitting device formed by epitaxial growth of semiconductor layers on a growth substrate may be used. The growth substrate may be formed of sapphire, but is not limited thereto. For example, a known growth substrate formed of spinel, SiC, GaN, GaAs or the like may be used. Specifically, the blue light emitting device 120 and the green light emitting device 130 may include n-type and p-type semiconductor layers and a light emitting layer interposed therebetween. The semiconductor layers of the blue light emitting device 120 and the green light emitting device 130 may be formed of BN, SiC, ZnSe, GaN, InGaN, InAlGaN, AlGaN, BAlGaN, BInAlGaN or the like. In addition, the light emitting layer of the blue light emitting device 120 and the green light emitting device 130 may be formed of a nitride semiconductor expressed by $In_xAl_yGa_{1-x-y}N$ ($0 \le x \le 1$, $0 \le y \le 1$, $1 \le x+y \le 1$), and may have a single or multi quantum well structure so that light output may be improved.

The blue light emitting device 120 and the green light emitting device 130 may emit blue light and green light from the respective light emitting layers thereof. Meanwhile, the green light emitted from the green light emitting device 130 has a full width at half maximum (FWHM) less than that of green light emitted from a green wavelength conversion material, e.g. a green phosphor, so that the light emitting device package 100 according to the present exemplary embodiment of the inventive concept may provide white light having superior color reproducibility as compared to a light emitting device emitting white light by using a green wavelength conversion material.

The blue light emitting device 120 and the green light emitting device 130 may be provided to have various configurations and may be mounted by various methods. For example, each of the blue light emitting device 120 and the green light emitting device 130 may have n-type and p-type electrodes formed on a top or bottom surface thereof. Alternatively, the n-type electrode may be formed on the top surface of the light emitting device and p-type electrode may be formed on the bottom surface of the light emitting device, respectively. In addition, the blue light emitting device 120 and the green light emitting device 130 may be electrically connected to each other in series or in parallel with respect to a driving power supply source.

The wavelength conversion part 141 may be formed of a light transmissive resin such as silicon or epoxy, and may include the red wavelength conversion material 143. Here, the red wavelength conversion material 143 may include at least one of a red phosphor and a quantum dot using light emitted from the light emitting device as excitation light to emit red light.

Figure 2:
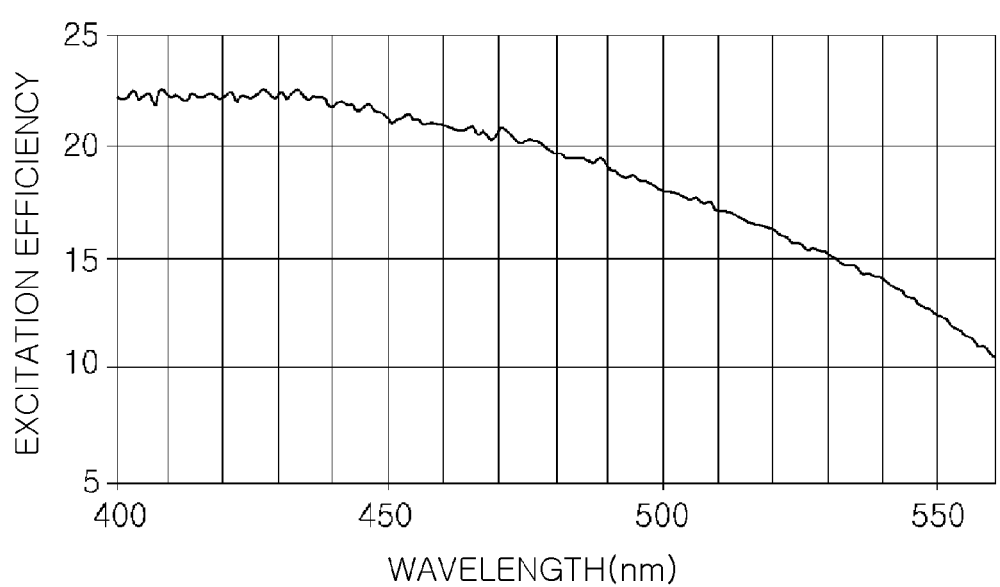
FIG. 2 is a graph illustrating excitation efficiency of a red wavelength conversion material according to a wavelength of excitation light.

Meanwhile, as illustrated in the graph of FIG. 2, in a case in which the red wavelength conversion material, e.g., a red phosphor is excited by blue light or green light to emit red light, excitation efficiency (a vertical axis) of blue light may be relatively high, while excitation efficiency of green light may be relatively low. That is, even in the case that green light is incident to the wavelength conversion part including the red phosphor, it may have relatively low efficiency in exciting the red phosphor to emit red light. The green light may suffer from scattering loss within the wavelength conversion part, resulting in a reduction in color reproducibility of white light and luminous intensity, so that an increase in power consumption may occur.

Therefore, the wavelength conversion part 141 may be disposed in a path of blue light emitted from the blue light emitting device 120 such that the red wavelength conversion material 143 may be excited by the blue light emitted from the blue light emitting device 120 having relatively high excitation efficiency, while avoiding interference with a path of green light emitted from the green light emitting device 130 having relatively low excitation efficiency. More specifically, the wavelength conversion part 141 may be positioned so as not to interfere with the path of the green light emitted from the green light emitting device 130 and travelling upwardly, for example, green light travelling in a direction perpendicular with respect to a mounting surface for the green light emitting device 130 and green light travelling within a predetermined angle range θ.

Accordingly, the package substrate 110 may include a flow prevention part substantially enclosing the blue light emitting device 120, and the wavelength conversion part 141 including the red wavelength conversion material 143 may be formed within a region defined by the flow prevention part, such that it only encompasses the blue light emitting device 120.

Here, the flow prevention part serves to control outward flow of the wavelength conversion part 141 so as to prevent the wavelength conversion part 141 from being introduced into a region for mounting the green light emitting device 130 when the wavelength conversion part 141 is applied to the package substrate 110 while separating a region for mounting the blue light emitting device 120 from the region for mounting the green light emitting device 130. The flow prevention part may allow the wavelength conversion part 141 to be disposed in the path of the blue light emitted from the blue light emitting device 120 and excited thereby, while being positioned so as not to be disposed in the path of the green light emitted from the green light emitting device 130 and travelling upwardly in consideration of the scattering loss of the green light emitted from the green light emitting device 130.

With reference to FIGS. 1A and 1B, the flow prevention part according to an embodiment of the inventive concept will be described in detail.

With reference to FIGS. 1A and 1B, the flow prevention part according to the present exemplary embodiment may be a protrusion part 114 substantially enclosing the blue light emitting device 120.

The protrusion part 114 may be provided to enclose the entire circumference of the blue light emitting device 120, but is not limited thereto. As shown in the plan view of FIG. 1B, a portion of the circumference of the blue light emitting device 120 is enclosed by the partition wall 112 and the other portion thereof is enclosed by the protrusion part 114, such that the region for mounting the blue light emitting device 120 may be defined thereby.

That is, the protrusion part 114 may be formed to substantially enclose the blue light emitting device 120 in order to separate the region for mounting the blue light emitting device 120 from the region for mounting the green light emitting device 130. The wavelength conversion part 141 may only be formed in the region in which the blue light emitting device 120 is mounted, of a region defined by the protrusion part 114 (or a region defined by the protrusion part 114 and the partition wall 112), such that it may only encompass the blue light emitting device 120 more easily.

When a height from the mounting surface for the blue light emitting device 120 to a top surface of the blue light emitting device 120 is defined as a mounting height H1 of the blue light emitting device 120, a height H2 of the protrusion part 114 may not exceed a height equal to three times the mounting height H1 in order not to interfere with a combination of first combined light and the green light emitted from the green light emitting device 130 within an encapsulation part 150, the first combined light being defined by a combination of the blue light emitted from the blue light emitting device 120 and the light emitted from the wavelength conversion part 141. The height H2 of the protrusion part 114 may be substantially equal to the mounting height H1, but the inventive concept is not limited thereto.

The light emitting device package 100 according to the present exemplary embodiment may further include the encapsulation part 150 formed on the package substrate 110. The encapsulation part 150 may be formed of a transparent resin such as silicon or epoxy, and may serve to protect the blue light emitting device 120 and the green light emitting device 130 from external impacts and foreign objects.

The encapsulation part 150 may further include a dispersant in order to facilitate the dispersion and combination of light. In addition, the encapsulation part 150 may not include a wavelength conversion material in order to prevent the scattering loss of the green light emitted from the green light emitting device 130, but the inventive concept is not limited thereto. In case, the encapsulation part 150 may include a wavelength conversion material at a predetermined level of concentration (a ratio of a weight of the wavelength conversion material to a total weight of the encapsulation part 150). A detailed description thereof will be provided below.

According to the present exemplary embodiment, the light emitting device package 100 may be able to emit white light having a high degree of color reproducibility by using green light having a relatively small FWHM and appropriately positioning the wavelength conversion part 141 in consideration of the excitation efficiency of the red wavelength conversion material 143 and the scattering loss of the green light. In addition, when the combination of the blue light emitted from the blue light emitting device 120 and the light emitted from the wavelength conversion part 141 is defined as the first combined light, the first combined light is mixed with the green light emitted from the green light emitting device 130 within the encapsulation part 150, so that white light having a high degree of color reproducibility may be obtained in a single light emitting device package 100.

Figure 3:
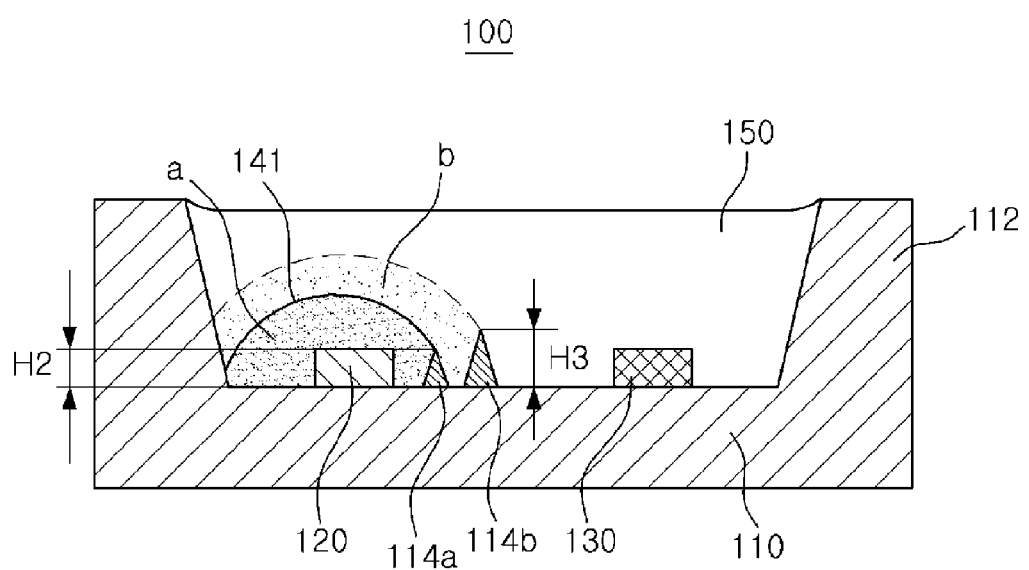
FIGS. 3 through 9B are views illustrating a light emitting device package according to other exemplary embodiments.

FIG. 3 shows a light emitting device package according to another exemplary embodiment, a modified example of the light emitting device package of FIG. 1.

With reference to FIG. 3, a plurality of protrusion parts 114a and 114b are provided. Respective heights H2 and H3 of the protrusion parts 114a and 114b may be gradually increased in a direction away from the blue light emitting device 120.

The wavelength conversion part 141 may be formed in any one of regions defined by the plurality of protrusion parts 114a and 114b. In this case, a size of the wavelength conversion part 141 may, if necessary, be easily adjusted, as indicated by a or b.

Figure 4A:
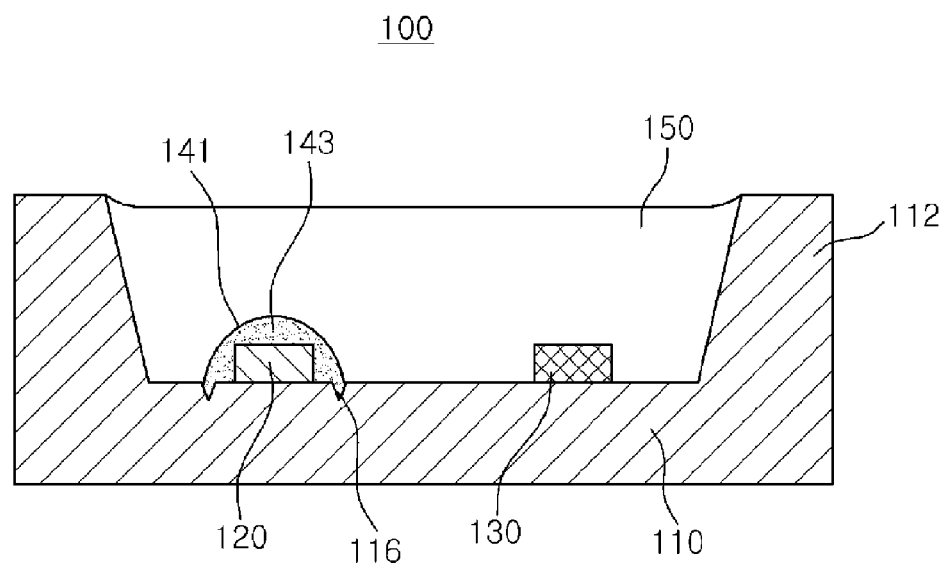
Figure 4B:
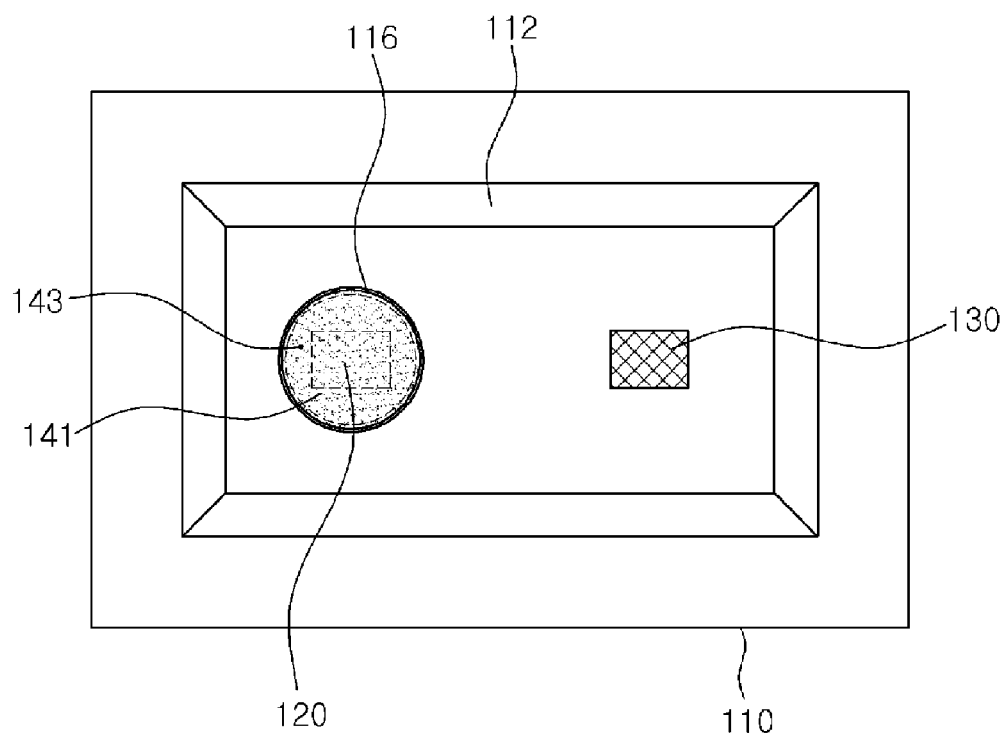

FIGS. 4A and 4B are cross-sectional and plan views illustrating a light emitting device package according to another exemplary embodiment, respectively.

According to the exemplary embodiment, a groove part 116 substantially enclosing the blue light emitting device 120 may be used as the flow prevention part. That is, the groove part 116 may be formed by cutting a portion of a surface of the package substrate 110 to thereby allow the flow of a resin applied to the blue light emitting device 120 to be stopped in the cut portion through surface tension. In this manner, a region for the wavelength conversion part 141 may be defined by a region enclosed by the groove part 116.

In this case, there is no region for blocking an optical path above the package substrate 110, and thus the combination of the blue light emitted from the blue light emitting device 120, the light emitted from the wavelength conversion part 141 and the green light emitted from the green light emitting device 130 may be facilitated.

Figure 5:
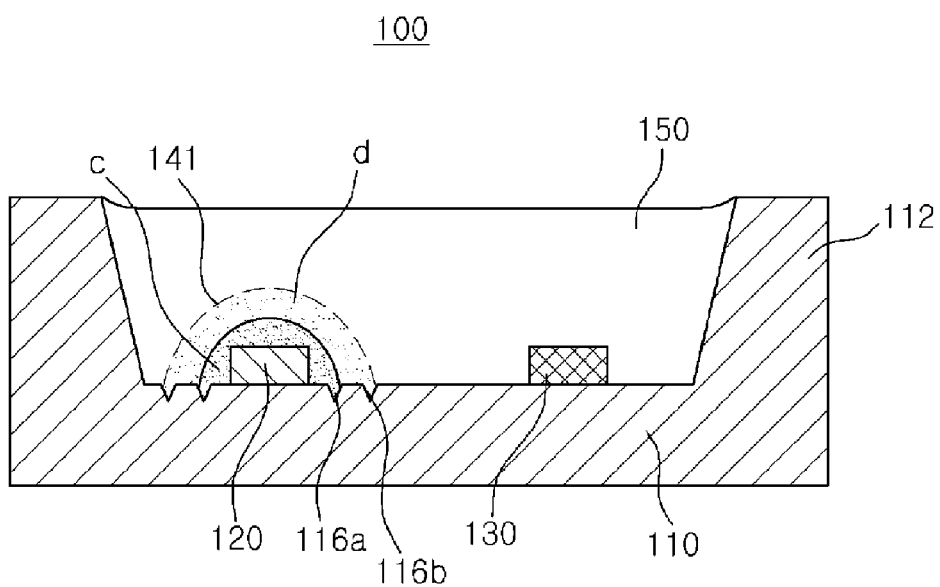

FIG. 5 shows a light emitting device package according to another exemplary embodiment, a modified example of the light emitting device package of FIG. 4.

With reference to FIG. 5, a plurality of groove parts 116a and 116b are provided. The wavelength conversion part 141 may be formed in any one of regions defined by the plurality of groove parts 116a and 116b. That is, similar to the embodiment of FIG. 3, a size of the wavelength conversion part 141 may, if necessary, be easily adjusted, as indicated by c or d. Even in the case that fabrication errors occur at the time of application of the wavelength conversion part 141, the wavelength conversion part 141 may be effectively prevented from being introduced into a mounting region for the green light emitting device 130.

Figure 6:
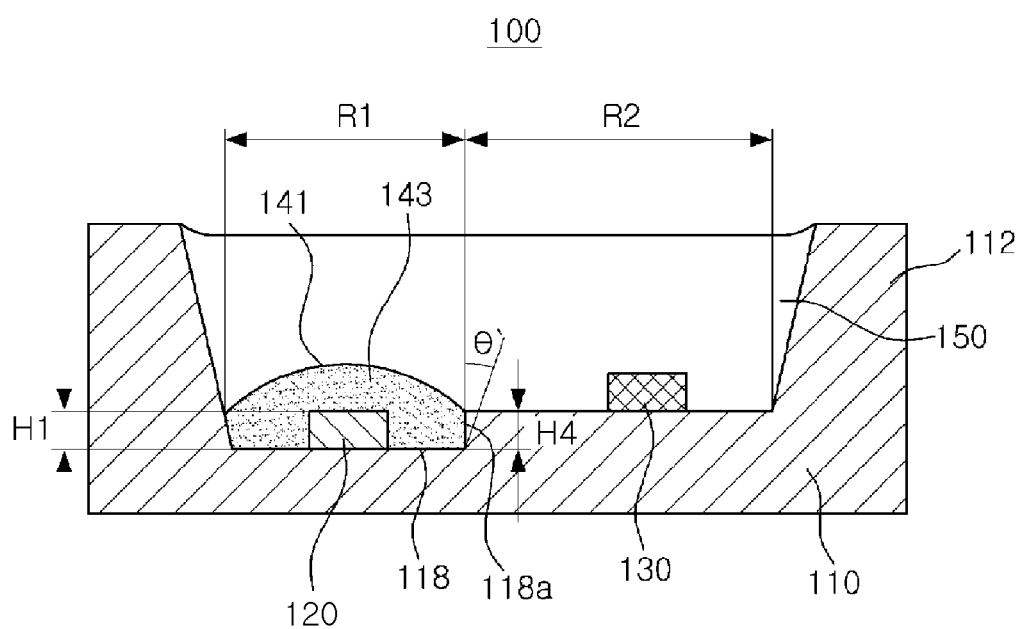

FIG. 6 is a cross-sectional view illustrating a light emitting device package according to another exemplary embodiment.

With reference to FIG. 6, the package substrate 110 may include a recess part 118, and the blue light emitting device 120 and the green light emitting device 130 may be mounted in regions divided by the recess part 118, respectively.

In the present exemplary embodiment, a boundary surface 118a of the recess part 118 may be used as the flow prevention part.

Specifically, the green light emitting device 130 is disposed in the outside R2 of the recess part 118 and the blue light emitting device 120 is disposed in the inside R1 of the recess part 118. The wavelength conversion part 141 fills the recess part 118 in order not to be leaked to the outside R2 of the recess part 118, so that the wavelength conversion part 141 may only encompass the blue light emitting device 120 more easily.

Meanwhile, similar to the above-mentioned embodiment, a height H4 of the boundary surface 118a of the recess part 118 may not exceed a height equal to three times the mounting height H1 of the blue light emitting device 120 in order not to interfere with the combination of the first combined light with the green light emitted from the green light emitting device 130 within the encapsulation part 150. For example, the height H4 of the boundary surface 118a of the recess part 118 may be substantially equal to the mounting height H1 of the blue light emitting device 120.

In addition, the boundary surface 118a of the recess part 118 is illustrated as a vertical plane in FIG. 6, but the inventive concept is not limited thereto. The boundary surface 118a of the recess part 118 may be inclined to have a predetermined angle θ' in a direction perpendicular with respect to the mounting surface for the light emitting device.

Figure 7:
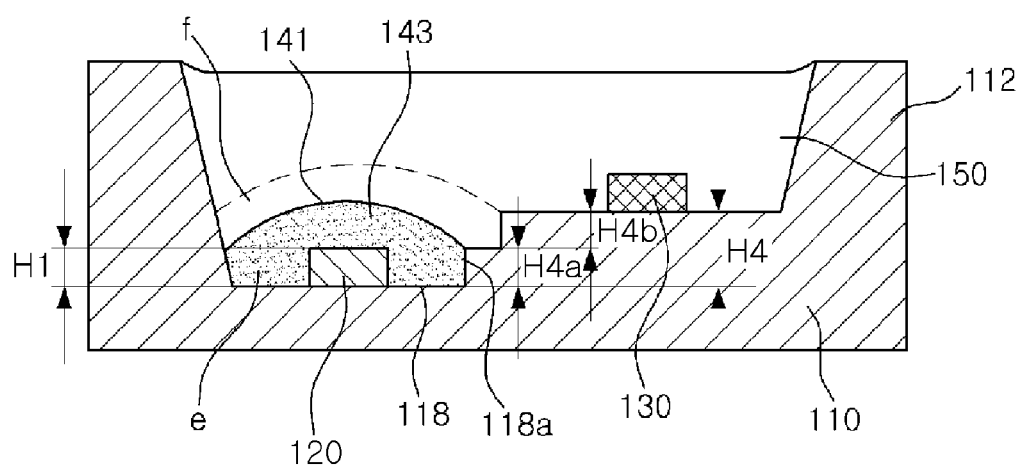

FIG. 7 shows a light emitting device package according to another exemplary embodiment, a modified example of the light emitting device package of FIG. 6.

With reference to FIG. 7, the package substrate 110 may further include a step formed on the boundary surface 118a of the recess part 118. Here, the step is not limited to the shape of FIG. 7.

Here, similar to the above-mentioned embodiment, the height H4 of the boundary surface 118a of the recess part 118 may not exceed a height equal to three times the mounting height H1 of the blue light emitting device 120. For example, a height H4a of a first step may be substantially equal to the mounting height H1 of the blue light emitting device 120, and a height H4b of a second step may be determined within a range in which the total height H4 of the boundary surface 118a of the recess part 118 (H4=H4a+H4b) does not exceed a height equal to three times the mounting height H1 of the blue light emitting device 120. According to the present exemplary embodiment, a size of the wavelength conversion part 141 may, if necessary, be easily adjusted, as indicated by e or f. Even in the case that fabrication errors occur at the time of application of the wavelength conversion part 141, the wavelength conversion part 141 may be effectively prevented from being introduced into the mounting region for the green light emitting device 130.

Figure 8:
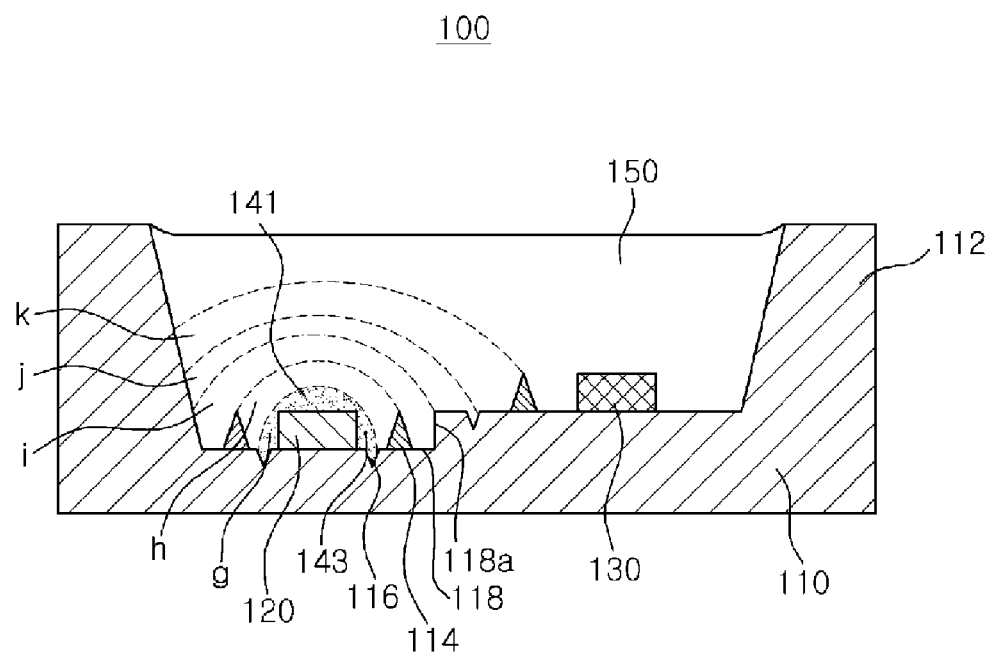

FIG. 8 is a cross-sectional view illustrating a light emitting device package according to another exemplary embodiment.

With reference to FIG. 8, the light emitting device package 100 according to the present exemplary embodiment may include the groove part 116, the protrusion part 114 and the recess part 118. Since the light emitting device package does not need to include all the elements as the flow prevention part, it may employ the groove part 116 and the protrusion part 118 as the flow prevention part, the protrusion part 114 and the recess part 118 as the flow prevention part, or the groove part 116 and the recess part 118 as the flow prevention part. That is, various types of the flow prevention part do not need to be exclusively employed, so that they may be implemented in various manners within a single light emitting device package 100.

According to the present exemplary embodiment, a size of the wavelength conversion part 141 may, if necessary, be easily adjusted, as indicated by g, h, i, j, or k. Even in the case that fabrication errors occur at the time of application of the wavelength conversion part 141, the wavelength conversion part 141 may be effectively prevented from being introduced into the mounting region for the green light emitting device 130. In addition, the plurality of wavelength conversion parts 141 including the red wavelength conversion material 143 at different levels of concentration may be consecutively formed in the plurality of regions g, h, i, j, and k defined by the flow prevention part complex, so that color reproducibility precision may be enhanced. For example, a wavelength conversion part including the red wavelength conversion material 143 at a high level of concentration may be formed in a region g defined by a flow prevention part closest to the blue light emitting device 120, and a wavelength conversion part including the red wavelength conversion material 143 at a relatively low level of concentration may be consecutively formed in one of regions h, i, j and k defined by other flow prevention parts. In this manner, the light emitting device package 100 may have enhanced color reproducibility precision.

Figure 9A:
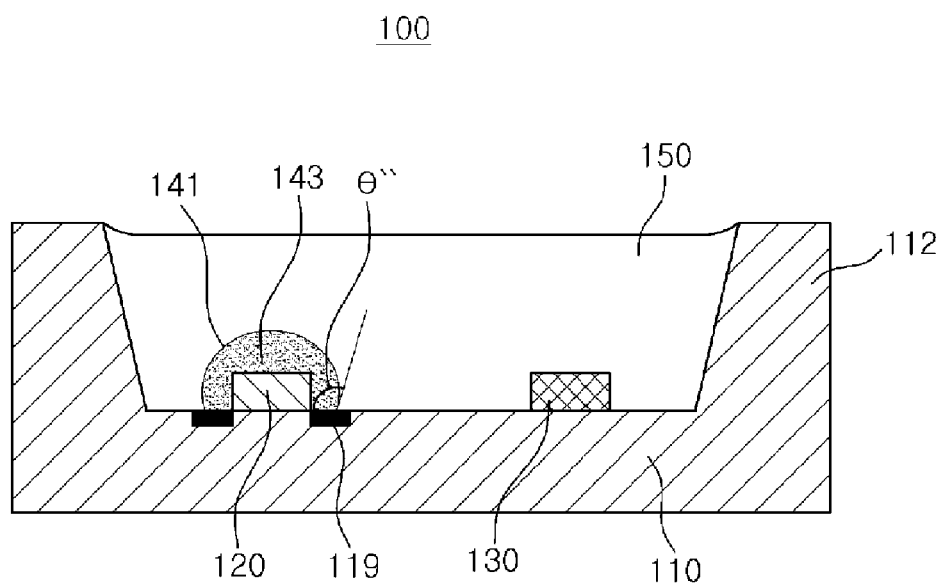
Figure 9B:
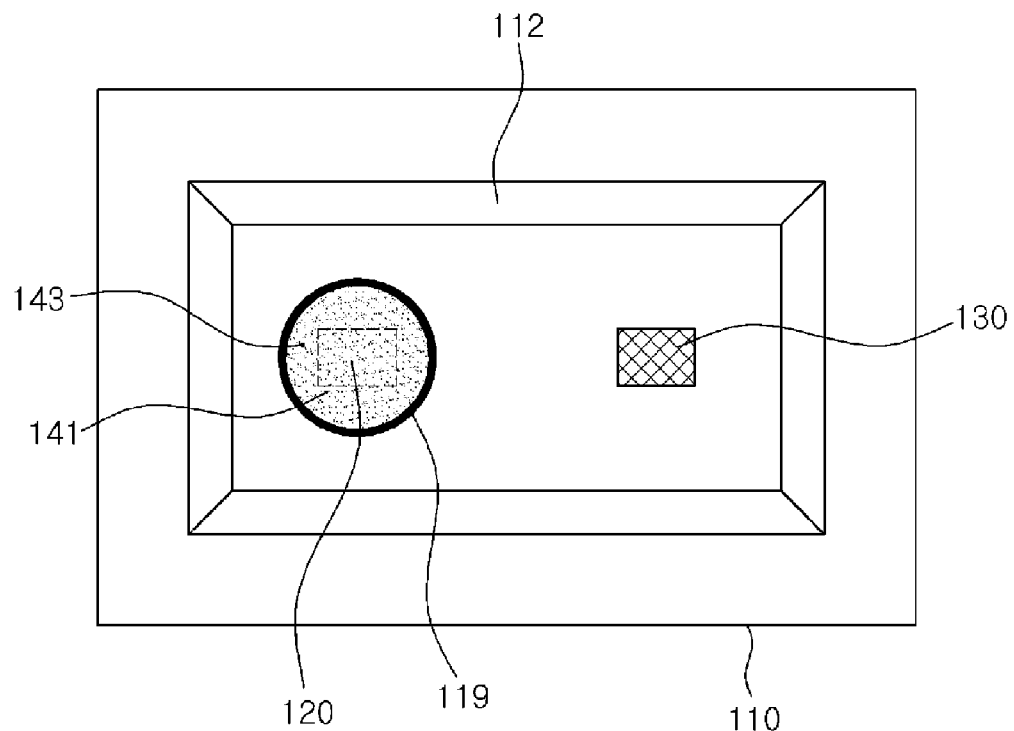

FIGS. 9A and 9B are cross-sectional and plan views illustrating a light emitting device package according to another exemplary embodiment, respectively.

With reference to FIGS. 9A and 9B, the light emitting device package 100 according to the present exemplary embodiment may include a hydrophilic region or a hydrophobic region substantially enclosing the blue light emitting device 120. In the present exemplary embodiment, a region 119 having hydrophilic properties or hydrophobic properties may be employed as the flow prevention part.

Specifically, the light emitting device package 100 may use a phase separation phenomenon according to immiscible properties between a hydrophilic material and a hydrophobic material. For example, in the case in which the wavelength conversion part 141 is formed to have hydrophilic properties, the flow prevention part may be formed as a hydrophobic region substantially enclosing the blue light emitting device 120. On the other hand, in the case in which the wavelength conversion part 141 is formed to have hydrophobic properties, the flow prevention part may be formed as a hydrophilic region substantially enclosing the blue light emitting device 120. In this manner, a contact angle θ" of the wavelength conversion part 141 may be controlled to thereby prevent the wavelength conversion part 141 from being introduced into the mounting region for the green light emitting device 130. The hydrophilic region or the hydrophobic region may be formed by a known hydrophilic or hydrophobic coating method such as a plasma process using methane gas, an application of a surfactant, or the like.

Since such a structure of the flow prevention part according to the present exemplary embodiment does not need to be exclusive from the flow prevention parts according to the above-described embodiments, the package substrate 110 may further include the protrusion part 114, the groove part 116 or the recess part 118.

Hereinafter, a method of manufacturing a light emitting device package according to an exemplary embodiment will be described. Descriptions of elements overlapping with those of the above-described embodiments will be omitted.

FIGS. 10A through 10E are cross-sectional views illustrating a method of manufacturing a light emitting device package according to an exemplary embodiment.

The light emitting device package 100 of FIGS. 10A through 10E employs the protrusion part 114 substantially enclosing the blue light emitting device 120 as the flow prevention part. However, this is merely considered to be an example, and the flow prevention part according to the manufacturing method is not limited to the protrusion part 114.

Figure 10A:
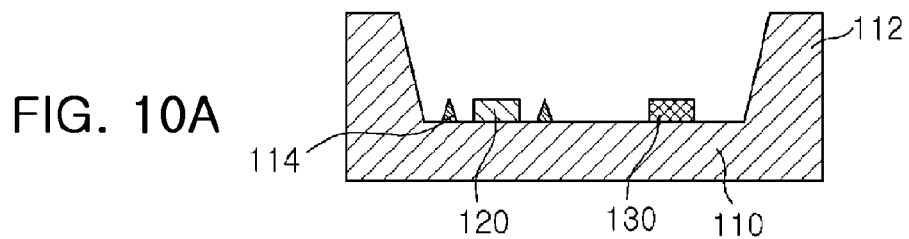
FIGS. 10A through 10E are cross-sectional views illustrating a method of manufacturing a light emitting device package according to an exemplary embodiment.

With reference to FIG. 10A, the method of manufacturing a light emitting device package according to the present exemplary embodiment starts with preparing the package substrate 110 including the flow prevention part substantially enclosing the blue light emitting device 120 and mounting the blue light emitting device 120 and the green light emitting device 130 on the package substrate 110.

Figure 10B:
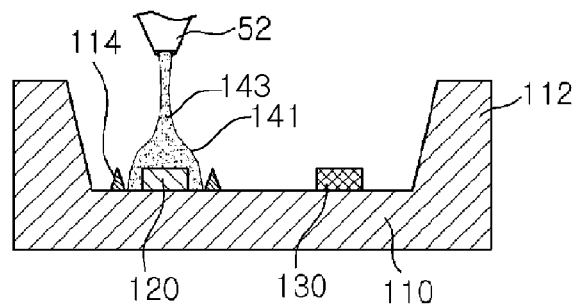

Next, as shown in FIG. 10B, the wavelength conversion part 141 including the red wavelength conversion material 143 is formed in a region defined by the flow prevention part. In this case, the wavelength conversion part 141 may only encompass the blue light emitting device 120 due to the flow prevention part.

Figure 10C:
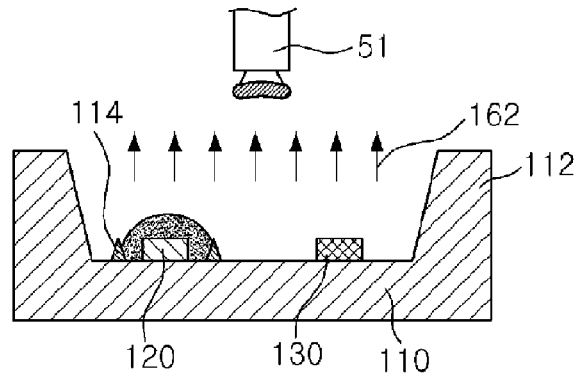

Meanwhile, prior to the next operation, the manufacturing method may further include measuring color characteristics of second combined light 162 emitted from the light emitting device package 110 as shown in FIG. 10C.

Here, the second combined light 162 refers to a combination of first combined light and the green light emitted from the green light emitting device 130, and the first combined light refers to a combination of the blue light emitted from the blue light emitting device 120 and the light emitted from the wavelength conversion part 141.

The color characteristics may include at least one of color coordinates and color temperature and the color characteristics of light emitted when electrical signals are applied to the green light emitting device 130 and the blue light emitting device 120 enclosed by the wavelength conversion part 141 may be measured using a color characteristics measuring device 51.

Figure 10D:
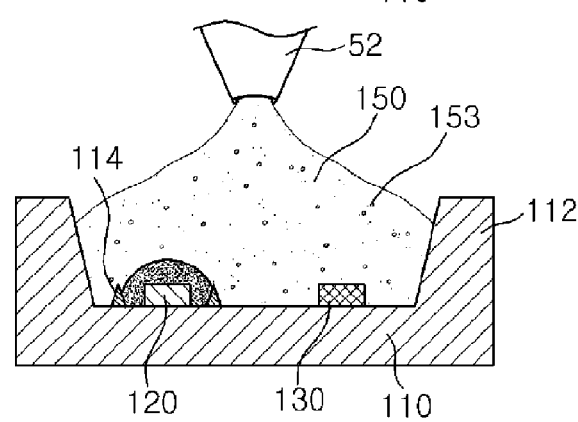

Next, as shown in FIG. 10D, the encapsulation part 150 may be formed on the package substrate 110.

In the present exemplary embodiment, the encapsulation part 150 may not include a wavelength conversion material in consideration of the scattering loss of the green light emitted from the green light emitting device 130. On the other hand, the encapsulation part 150 may include a second wavelength conversion material 153 at a level of concentration set to correct a deviation of actual color characteristics of the second combined light 162 from desired color characteristics thereof according to the results of the color characteristics measuring operation. Here, a concentration of the second wavelength conversion material 153 (a ratio of a weight of the second wavelength conversion material 153 to a total weight of the encapsulation part 150) may be set to be lower than a concentration of the red wavelength conversion material 143 included in the wavelength conversion part 141 (a ratio of a weight of the red wavelength conversion material 143 to a total weight of the wavelength conversion part 141) in consideration of the scattering loss of the green light emitted from the green light emitting device 130.

Figure 10E:
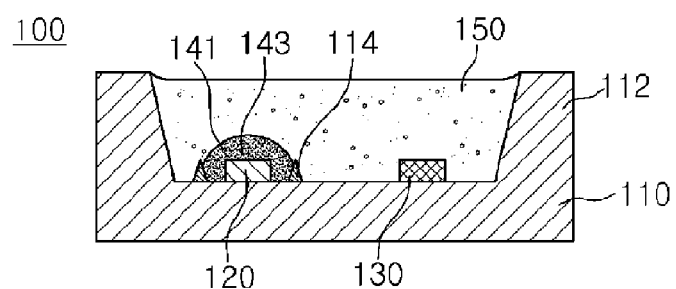

FIG. 10E illustrates the light emitting device package 100 obtained by the above operations.

The light emitting device package 100 according to the present exemplary embodiment uses green light having a small FWHM and the wavelength conversion part disposed to minimize the scattering loss of the green light, so that white light having a high degree of color reproducibility by being corrected to have desired color characteristics may be emitted thereby.

Figure 11:
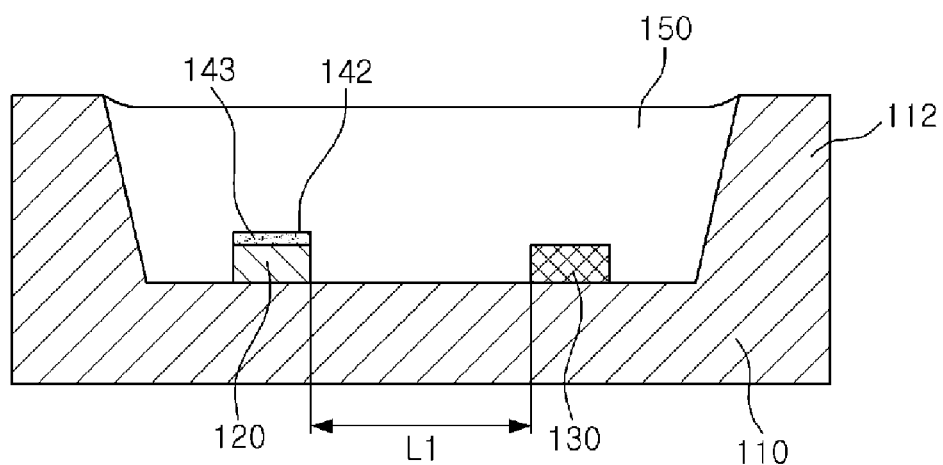
FIG. 11 is a cross-sectional view illustrating a light emitting device package according to another exemplary embodiment.

FIG. 11 is a cross-sectional view illustrating a light emitting device package 200 according to another exemplary embodiment.

With reference to FIG. 11, a wavelength conversion part 142 may be formed on a region defined as a top surface of the blue light emitting device 120. The wavelength conversion part may be a molding-type wavelength conversion part as shown in FIG. 1, or may be a film-type wavelength conversion part as shown in FIG. 11. For example, the wavelength conversion part 142 may be formed by attaching a semi-cured resin film to the top surface of the blue light emitting device 120 and being cured by a heat treatment process.

According to the present exemplary embodiment, the blue light emitting device 120 having the wavelength conversion part 142 formed thereon is prepared in advance, and thus, a process of molding the wavelength conversion part 142 on the package substrate 110 may be omitted and a limitation on a mounting distance L1 of the blue light emitting device 120 and the green light emitting device 130 may be alleviated.

Hereinafter, a method of manufacturing the light emitting device package 200 of FIG. 11 will be described.

FIGS. 12A through 12D are cross-sectional views illustrating a method of manufacturing the light emitting device package of FIG. 11.

Figure 12A:
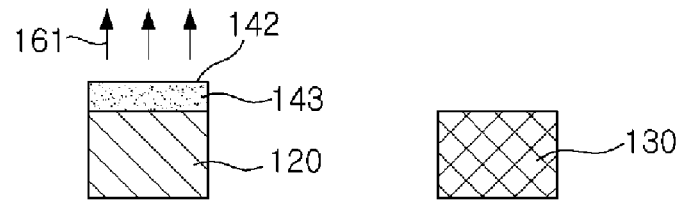
FIGS. 12A through 12D are cross-sectional views illustrating a method of manufacturing the light emitting device package of FIG. 11.

With reference to FIG. 12A, the method of manufacturing the light emitting device package 200 of FIG. 11 starts with preparing the green light emitting device 130 and the blue light emitting device 120 having the wavelength conversion part 142 formed thereon. The wavelength conversion part 142 may include the red wavelength conversion material 143 and may only be formed on the top surface of the blue light emitting device 120.

The green light emitting device 130 and the blue light emitting device 120 may include n-type and p-type semiconductor layers and a light emitting layer interposed therebetween and emitting green light and blue light, respectively. In addition, the wavelength conversion part 142 may be a film type wavelength conversion part attached to the top surface of the blue light emitting device 120 and being cured by a heat treatment process.

Next, when a combination of light emitted from the wavelength conversion part 142 and the blue light emitted from the blue light emitting device 120 is defined as first combined light 161, the color characteristics of the first combined light 161 may be measured. Here, the color characteristics may include at least one of color coordinates and color temperature, and the color characteristics of light emitted when electrical signals are applied to the green light emitting device 130 and the blue light emitting device 120 having the wavelength conversion part 142 formed thereon may be measured using the color characteristics measuring device 51.

Figure 12B:
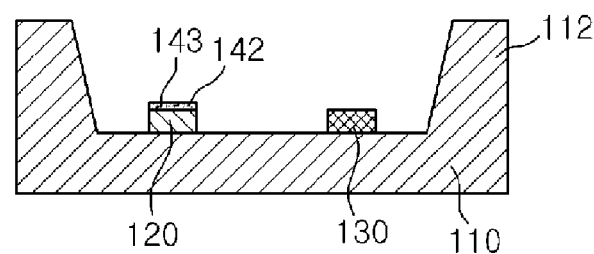

Next, as shown in FIG. 12B, the green light emitting device 130 and the blue light emitting device 120 may be mounted on the package substrate 110. The mounting of the light emitting devices on the package substrate 110 may be performed by various known methods.

Figure 12C:
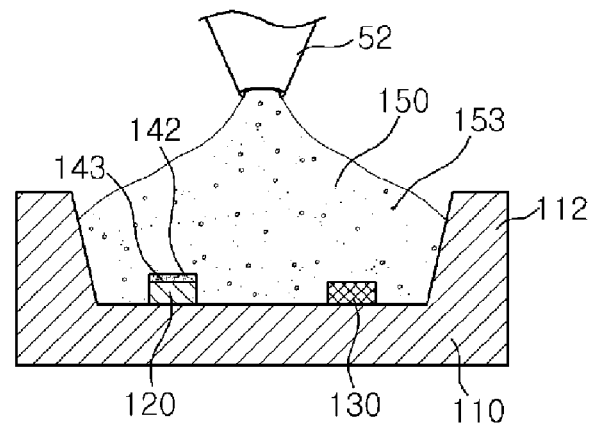

Next, as shown in FIG. 12C, the encapsulation part 150 may be formed on the package substrate 110. The encapsulation part 150 may be formed by being discharged from a dispenser 52 and introduced onto the package substrate 110, and may not include a wavelength conversion material in consideration of the scattering loss of the green light emitted from the green light emitting device 130.

However, the inventive concept is not limited thereto. The encapsulation part 150 may include a wavelength conversion material (hereinafter, referred to as the second wavelength conversion material 153) excited by excitation light to emit light having a different wavelength. A detailed description thereof will be provided with reference to FIG. 13.

Figure 13:
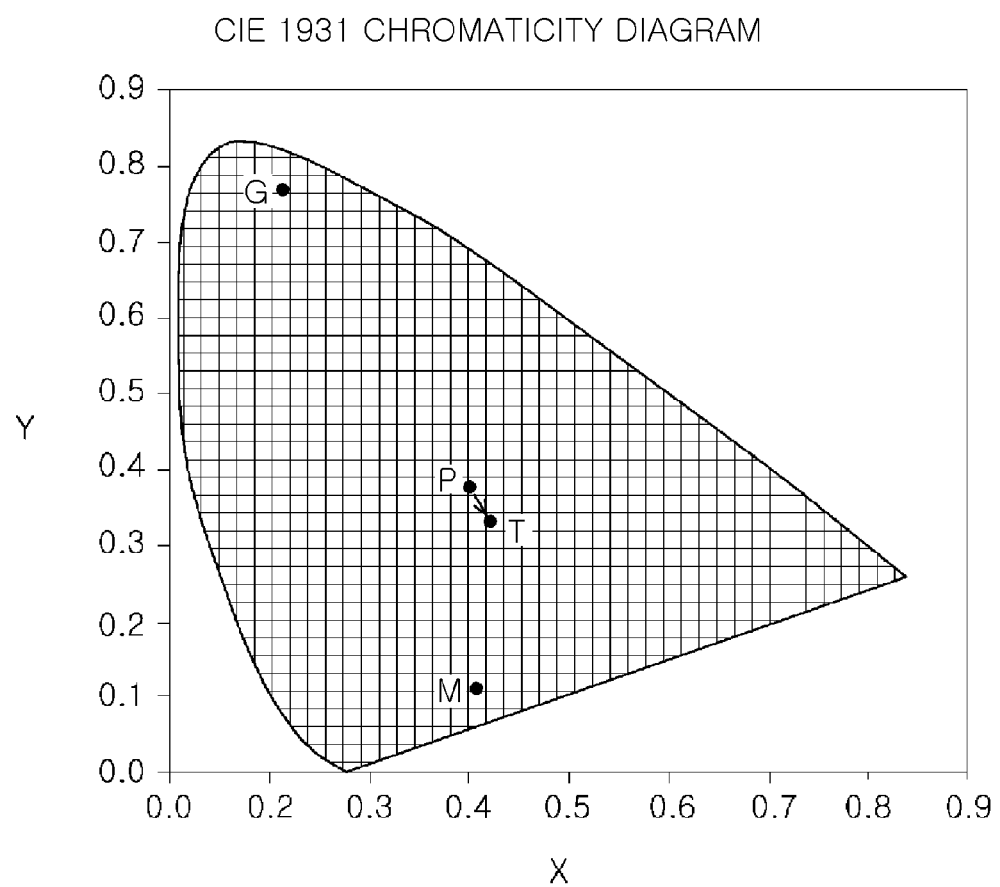
FIG. 13 is the CIE 1931 chromaticity diagram.

FIG. 13 is the CIE 1931 chromaticity diagram.

With reference to FIG. 13, the color coordinates of the first combined light 161 obtained in the measuring of the color characteristics are indicated by M, and the color coordinates of the green light emitted from the green light emitting device 130 are indicated by G. Here, the color coordinates of the first combined light 161 and the green light may be measured using the color characteristics measuring device 51.

Meanwhile, the first combined light 161 and the green light may be mixed based on the coordinates M and G, such that the color coordinates of white light (hereinafter, referred to as second combined light) emitted from the light emitting device package 200 may be, for example, predicted as P.

Therefore, in this operation, the encapsulation part 150 may include the second wavelength conversion material 153 at a level of concentration set to correct a deviation of the color coordinates P of the second combined light from desired color coordinates T. In addition, the second wavelength conversion material 153 may be at least one of red, green and yellow wavelength conversion materials. In the case in which the second wavelength conversion material 153 is the red wavelength conversion material, a concentration of the second wavelength conversion material 153 may be set to be lower than that of the red wavelength conversion material 143 included in the wavelength conversion part 142 in consideration of the scattering loss of the green light emitted from the green light emitting device.

Figure 12D:
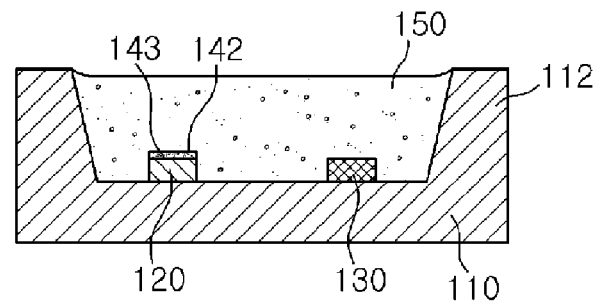

FIG. 12D illustrates the light emitting device package 200 obtained by the above operations. The light emitting device package 200 according to the present exemplary embodiment uses green light having a small FWHM and the wavelength conversion part 142 disposed to minimize the scattering loss of the green light, so that white light having a high degree of color reproducibility by being corrected to have desired color characteristics may be emitted thereby.

As set forth above, a light emitting device package according to exemplary embodiments can emit white light having a high degree of color reproducibility. Further, according to exemplary embodiments, a method of manufacturing the light emitting device package can be provided.

While exemplary embodiments been shown and described above, it will be apparent to those skilled in the art that modifications and variations can be made without departing from the spirit and scope of the present inventive concept as defined by the appended claims.

What is claimed is:

1. A light emitting device package comprising:
a package substrate;
a blue light emitting device (LED) and a green light emitting device (LED) mounted on the package substrate;
a protrusion disposed on the package substrate and substantially enclosing the blue LED, the protrusion dividing the package substrate into a blue LED mounting region in which the blue LED is mounted and a green LED mounting region in which the green LED is mounted; and
a wavelength conversion part including a red wavelength conversion material and disposed on the blue LED mounting region defined by the protrusion to cover the blue LED, the wavelength conversion part not being disposed on the green LED mounting region,
wherein a surface interfacing between the protrusion and the package substrate is substantially coplanar with a surface interfacing between the blue LED and the package substrate, and
a height of an uppermost portion of the protrusion is less than a height equal to three times a mounting height of the blue LED.

2. The light emitting device package of claim 1, wherein the height of the uppermost portion of the protrusion part is substantially equal to the mounting height of the blue LED.

3. The light emitting device package of claim 1, wherein the protrusion includes a plurality of protrusions having respective heights increasing in a direction away from the blue LED, and
the wavelength conversion part is formed in a region defined by any one of the plurality of protrusions.

4. The light emitting device package of claim 1, further comprising a groove disposed on the package substrate and substantially enclosing the blue LED,
wherein the groove is disposed in a surface coplanar with the surface interfacing between the blue LED and the substrate package, and
wherein the level of the lowermost portion of the groove is lower than the level of the surface interfacing between the blue LED and the substrate package.

5. The light emitting device package of claim 4, wherein the groove includes a plurality of grooves, and
the wavelength conversion part is disposed in a region defined by any one of the plurality of grooves.

6. The light emitting device package of claim 1, further comprising a recess formed in the package substrate,
wherein the blue LED is disposed within the recess and the green LED is disposed outside the recess.

7. Light emitting device package of claim 6, wherein a height of the boundary surface of the recess is substantially equal to a mounting height of the blue LED.

8. The light emitting device package of claim 1, wherein the wavelength conversion part has hydrophilic properties or hydrophobic properties, and
the package substrate has hydrophobic properties or hydrophilic properties opposite to those of the wavelength conversion part, and is provided as a hydrophobic region or a hydrophilic region substantially enclosing the blue LED.

9. The light emitting device package of claim 1, further comprising an encapsulation part formed on the package substrate,
when a combination of light emitted from the blue LED and light emitted from the wavelength conversion part is defined as first combined light, the first combined light is mixed with light emitted from the green LED within the encapsulation part.

10. The light emitting device package of claim 9, wherein the encapsulation part includes a second wavelength conversion material.

11. The light emitting device package of claim 10, wherein the second wavelength conversion material is a red wavelength conversion material, and a concentration of the second wavelength conversion material is lower than that of the red wavelength conversion material included in the wavelength conversion part.

12. The light emitting device package of claim 11, wherein when a combination of the first combined light and the light emitted from the green LED is defined as second combined light, a concentration of the second wavelength conversion material is set to correct a deviation of actual color characteristics of the second combined light from desired color characteristics thereof.

13. The light emitting device package of claim 1, wherein a top surface of the protrusion is below or at same level with a top surface of the blue LED.

14. The light emitting device package of claim 1, wherein the wavelength conversion part only includes the red wavelength conversion material as a wavelength conversion material.

* * * * *